United States Patent
Falk-Wallace

(10) Patent No.: US 10,460,514 B2
(45) Date of Patent: Oct. 29, 2019

(54) COMPUTING REPRESENTATIVE SHAPES FOR POLYGON SETS

(71) Applicant: GOOGLE INC., Mountain View, CA (US)

(72) Inventor: William Falk-Wallace, Mountain View, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 15/689,403

(22) Filed: Aug. 29, 2017

(65) Prior Publication Data
US 2019/0066372 A1 Feb. 28, 2019

(51) Int. Cl.
*G06F 17/50* (2006.01)
*G06T 17/05* (2011.01)
*G06F 16/901* (2019.01)
*G06F 16/29* (2019.01)

(52) U.S. Cl.
CPC .......... *G06T 17/05* (2013.01); *G06F 16/9024* (2019.01); *G06F 17/50* (2013.01); *G06F 16/29* (2019.01)

(58) Field of Classification Search
None
See application file for complete search history.

(56) References Cited

U.S. PATENT DOCUMENTS

| | | |
|---|---|---|
| 6,665,840 B1 | 12/2003 | Wiley et al. |
| 9,245,366 B1 | 1/2016 | Magouyrk et al. |
| 2004/0150640 A1* | 8/2004 | Park .................. G06T 17/00 345/419 |
| 2004/0227750 A1* | 11/2004 | Su .................... G06T 11/203 345/419 |
| 2010/0045671 A1* | 2/2010 | Slabaugh ............ G06T 17/10 345/420 |
| 2010/0161376 A1* | 6/2010 | Spagnolo ........... G06Q 10/00 705/7.34 |
| 2013/0328882 A1* | 12/2013 | Pirwani ............. G06K 9/6223 345/441 |

(Continued)

OTHER PUBLICATIONS

Agafonkin, "A new algorithm for finding a visual center of a polygon," Mapbox (2016). Retrieved from the Internet at: URL:https://blog.mapbox.com/a-new-algorithm-for-finding-a-visual-center-of-a-polygon-7c77e6492fbc.

(Continued)

*Primary Examiner* — Said Broome
(74) *Attorney, Agent, or Firm* — Marshall, Gerstein & Borun LLP

(57) ABSTRACT

A technique for efficiently processing sets of shapes is executed by one or more processors. The technique includes receiving a description of a set of shapes, the description including an indication of geometry for each of the shapes and an indication of positioning of the shapes relative to each other; generating a connected graph containing each shape in the set to define an ordered list; for each pair of shapes adjacent to each other in the connected graph, generating a respective convex hull enclosing the pair of shapes; generating a representative shape for the set of shapes, the representative shape enclosing each of the generated convex hulls; and operating on the generated representative shape to perform an operation related to the set of shapes.

17 Claims, 10 Drawing Sheets

(56) References Cited

U.S. PATENT DOCUMENTS

2015/0324694 A1* 11/2015 Wang .................... G06N 3/006
                                                        706/12

OTHER PUBLICATIONS

Aisch, "Alpha-shapes aka concave hulls in d3," (2016). Retrieved from the Internet at: URL:http://bl.ocks.org/gka/1552725.

Amenta et al., "The power crust, unions of balls, and the medial axis transform," Computational Geometry, 19(2-3):127-153 (2001).

Amenta et al., "The Power Crust," Proceedings of the sixth ACM symposium on Solid modeling and applications, pp. 249-266 (2001).

Asaeedi et al., "Alpha-Concave Hull, a Generalization of Convex Hull," Theoretical Computer Science, 702:48-59 (2017).

Attali, "r-regular shape reconstruction from unorganized points," Computational Geometry, 10(4):239-247 (1998).

Bernardini et al., "The Ball-Pivoting Algorithm for Surface Reconstruction," IEEE Transactions on Visualization and Computer Graphics, 5(4):349-359 (1999).

Boissonnat et al., "Smooth surface reconstruction via natural neighbour interpolation of distance functions," Computational Geometry, 22(1-3):185-203 (2002).

Duckham et al., "Efficent Generation of Simple Polygons for Characterizing the Shape of a Set of Points in the Plane," Pattern Recognition, 41(10):3224-3236 (2008).

Dwyer, "Drawing Boundaries in Python," (2014). Retrieved from the Internet at: URL:http://blog.thehumangeo.com/2014/05/12/drawing-boundaries-in-python/.

Edelsbrunner et al., "On the shape of a set of points in the plane," IEEE Transactions on Information Theory, 29(4):551-559 (1983).

Fischer, "Introduction to Alpha Shapes," Standford Computer Graphics Laboratory (2000).

Galton et al., "What Makes a Good Footpring?" (2008).

International Search Report and Written Opinion for Application No. PCT/US2018/033178, dated Sep. 20, 2018.

McCallum et al., "A linear algorithm for finding the convex hull of a simple polygon," Information Process Letters, 9(5):201-206 (1979).

Park et al., "A New Concave Hull Algorithm and Concaveness Measure for n-dimensional Datasets," Journal of Information Science and Engineering, 29(2):379-392 (2013).

Rosen et al., "Implementation of a Fast and Efficient Concave Hull Algorithm," Project in Computational Science (2014).

Sinclair, "S-hull: A Fast Radial Sweep-Hull Routine for Delaunay Triangulation," Computational Geometry (2016).

* cited by examiner

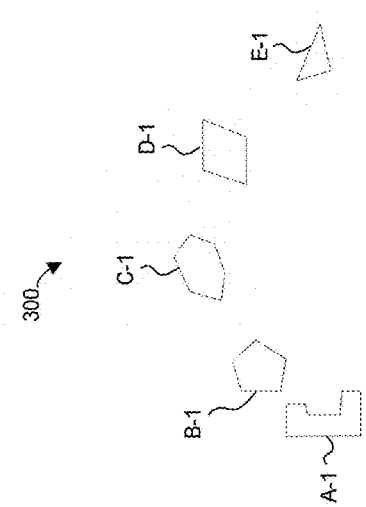
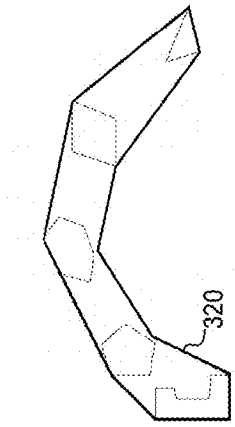
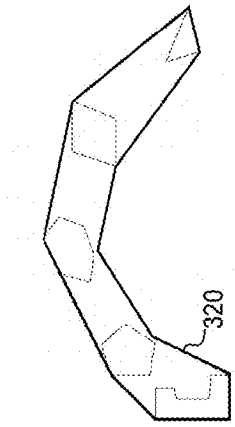
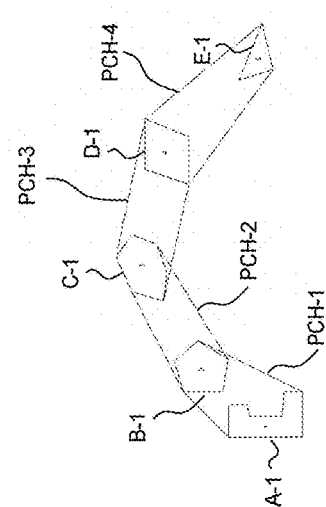
FIG. 5A
FIG. 5B
FIG. 5C
FIG. 5D

FIG. 6A
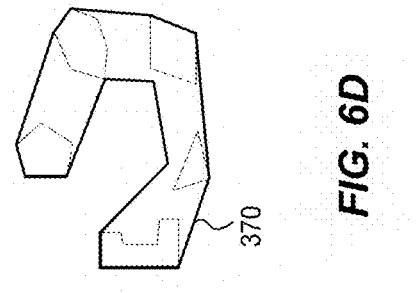
FIG. 6B
FIG. 6C
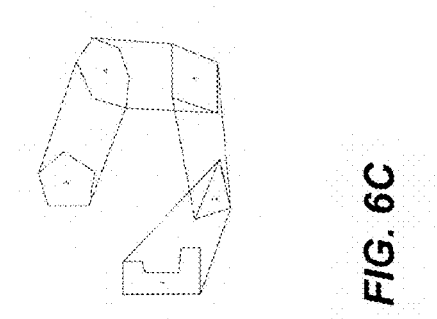
FIG. 6D

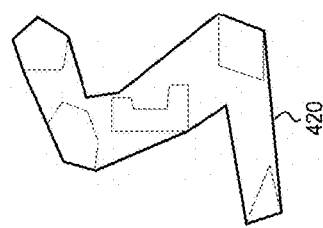

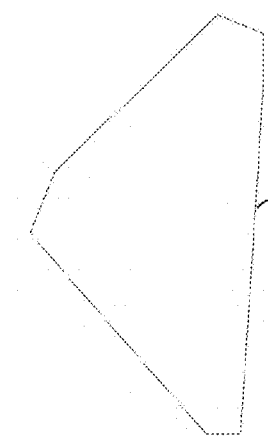
FIG. 8B
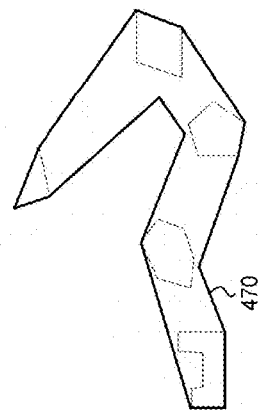
FIG. 8D
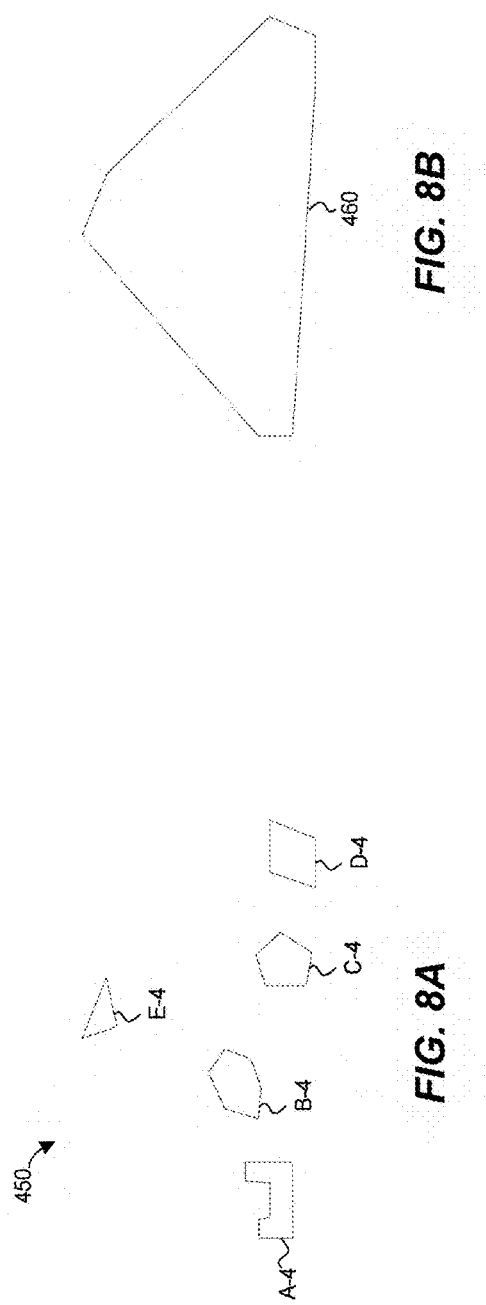
FIG. 8A
FIG. 8C

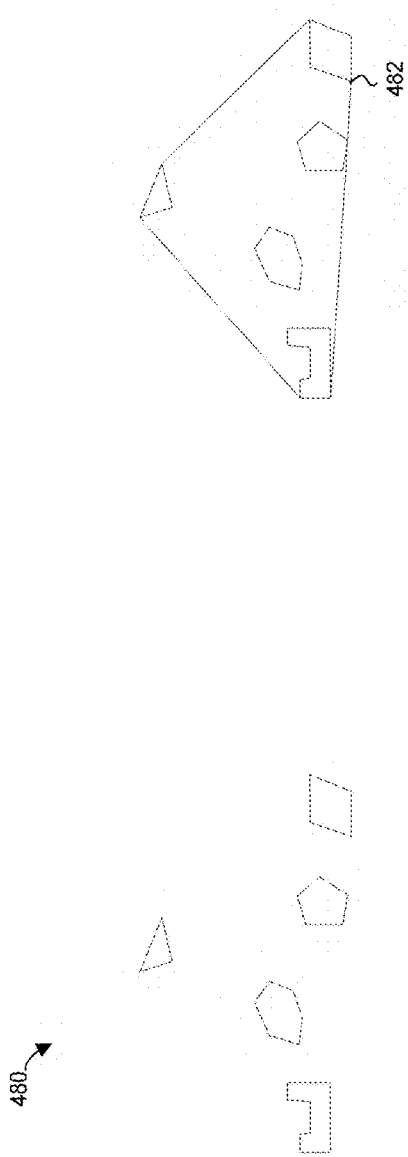
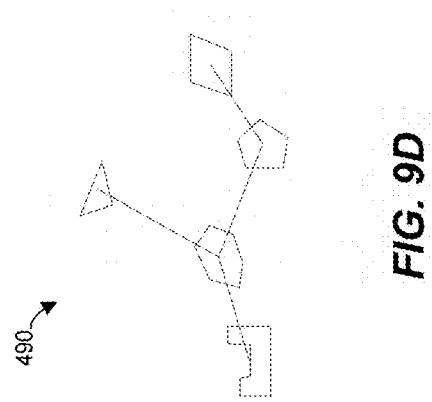
FIG. 9A  FIG. 9B  FIG. 9C  FIG. 9D

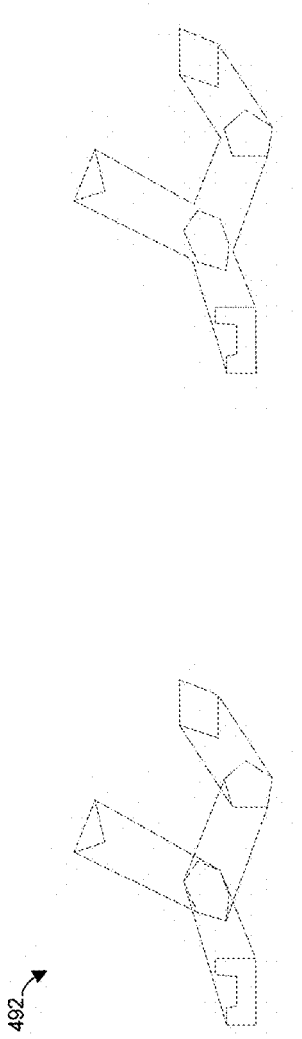
FIG. 9E
FIG. 9F
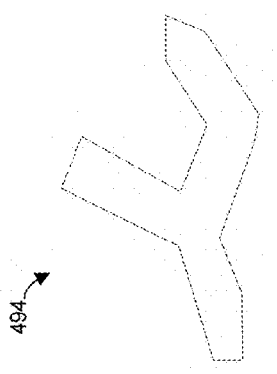
FIG. 9G

COMPUTING REPRESENTATIVE SHAPES FOR POLYGON SETS

FIELD OF TECHNOLOGY

This disclosure relates to processing geometric data for various computing applications, and more particularly, to computing a representative shape for a set of polygons.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Numerous applications in computer vision, geographic services, gaming, etc. implement algorithms for characterizing the shape or bounds of a region, which may be defined by a collection of points and/or polygons. In general, the existing techniques are based on characterizing points and polygons in two- and three-dimensional spaces using bounding hulls (or alpha shapes or representative shapes). These techniques include computation of power crusts, chi shapes, and other generalizations of bounding hulls. However, these approaches often fail to narrowly describe the underlying constituent geometry of such regions. Although there is a single minimal-area convex hull which can be computed efficiently for a set of points, the minimal-area convex often does not meaningfully represent the visual "shape" of the set of points. Moreover, concave hull construction often requires careful analysis of the input data to determine meaningful resolutions at which data should be sampled as well as to define the level of allowable concavity. The creation of a visually representative concave hull may require further tuning, depending on the algorithm being used, thus further increasing computational cost.

SUMMARY

Using the techniques of this disclosure, a system efficiently and accurately computes a representative shape for a certain set of geometric shapes, e.g., polygons. The representative shape encompasses the set of shapes in a manner that accurately conveys the overall geometry of the set.

More particularly, one embodiment of these techniques is a method for efficiently processing sets of shapes executed by one or more processors. The method includes receiving a description of a set of shapes, the description including an indication of geometry for each of the shapes and an indication of positioning of the shapes relative to each other. The method further includes generating a connected graph containing each shape in the set; for each pair of shapes adjacent to each other in the connected graph, generating a respective convex hull enclosing the pair of shapes; and generating a representative shape for the set of shapes, where the representative shape encloses each of the generated convex hulls. The method also includes operating on the generated representative shape to perform an operation related to the set of shapes (such as applying a label, selecting the set for highlighting, using the representative shape in image classification, or reconstructing an object from a point-cloud, for example).

Another embodiment of these techniques is a system comprising one or more processors and a computer-readable memory storing instructions. When executed by the one or more processors, the instructions cause the system to receive a description of a set of shapes, the description including an indication of geometry for each of the shapes and an indication of positioning of the shapes relative to each other, generate a connected graph containing each shape in the graph, for each pair of shapes adjacent to each other in the connected graph, generate a respective convex hull enclosing the pair of shapes, generate a representative shape for the set of shapes, the representative shape enclosing each of the generated convex hulls, and operate on the generated representative shape to perform an operation related to the set of shapes.

Yet another embodiment of these techniques is a non-transitory computer-readable medium that stores instructions implementing a method for efficiently processing sets of shapes executed by one or more processors. The method includes receiving a description of a set of shapes, the description including an indication of geometry for each of the shapes and an indication of positioning of the shapes relative to each other. The method further includes generating a connected graph containing each shape in the set; for each pair of shapes adjacent to each other in the connected graph, generating a respective convex hull enclosing the pair of shapes; and generating a representative shape for the set of shapes, where the representative shape encloses each of the generated convex hulls. The method also includes operating on the generated representative shape to perform an operation related to the set of shapes (such as applying a label, selecting the set for highlighting, using the representative shape in image classification, or reconstructing an object from a point-cloud, for example).

BRIEF DESCRIPTION OF THE DRAWINGS

FIG. 5A illustrates an example set of polygons in a relative arrangement generally similar to an arc, on which the systems of FIGS. 1 and 2 can operate;

FIG. 5B illustrates a convex hull generated for the set of polygons of FIG. 5A using known techniques;

FIG. 5C illustrates an example ordering of the set of polygons of FIG. 5A and pairwise convex hulls which the systems of FIGS. 1 and 2 can generate in accordance with the ordering when computing a representative shape;

FIG. 5D illustrates an example representative shape which the systems of FIGS. 1 and 2 can generate using the pairwise convex hulls illustrated in FIG. 5C;

FIG. 6A illustrates an example set of polygons in a relative arrangement generally similar to a loop, on which the systems of FIGS. 1 and 2 can operate;

FIG. 6B illustrates a convex hull generated for the set of polygons of FIG. 6A using known techniques;

FIG. 6C illustrates an example ordering of the set of polygons of FIG. 6A and pairwise convex hulls which the systems of FIGS. 1 and 2 can generate in accordance with the ordering when computing a representative shape;

FIG. 6D illustrates an example representative shape which the systems of FIGS. 1 and 2 can generate using the pairwise convex hulls illustrated in FIG. 6C;

FIG. 7A illustrates an example set of polygons in a relative arrangement generally similar to the letter 'S' (ess), on which the systems of FIGS. 1 and 2 can operate;

FIG. 7B illustrates a convex hull generated for the set of polygons of FIG. 7A using known techniques;

FIG. 7C illustrates an example ordering of the set of polygons of FIG. 7A and pairwise convex hulls which the systems of FIGS. 1 and 2 can generate in accordance with the ordering when computing a representative shape;

FIG. 7D illustrates an example representative shape which the systems of FIGS. 1 and 2 can generate using the pairwise convex hulls illustrated in FIG. 7C;

FIG. 8A illustrates an example set of polygons in a relative arrangement generally similar to a hook, on which the systems of FIGS. 1 and 2 can operate;

FIG. 8B illustrates a convex hull generated for the set of polygons of FIG. 8A using known techniques;

FIG. 8C illustrates an example ordering of the set of polygons of FIG. 8A and pairwise convex hulls which the systems of FIGS. 1 and 2 can generate in accordance with the ordering when computing a representative shape;

FIG. 8D illustrates an example representative shape which the systems of FIGS. 1 and 2 can generate using the pairwise convex hulls illustrated in FIG. 8C;

FIGS. 9A-G illustrate application of a minimum spanning approach to a set of polygons to generate a representative shape.

DETAILED DESCRIPTION OF THE DRAWINGS

This disclosure provides efficient and accurate techniques for constructing a representative shape for a set of polygons and/or points, which can be implemented in one or several computing devices. As discussed in more detail below, the techniques can include receiving geometric data that specifies polygons and relative positioning of these polygons or, in some cases, generating polygon data from a set of points. The one or several computing devices that implement the techniques then can order the polygons, traverse the resulting list, compute pairwise convex hulls in accordance with the order of traversal, and compute a union of the pairwise convex hulls (or another suitable grouping of the pairwise convex hulls).

For clarity, the examples discuss below relate primarily to representative shapes enclosing polygons. The techniques of this disclosure however also can be applied to representative shapes enclosing plane shapes with one or several arcuate sides. Further, these techniques can be applied to three-dimensional (3D) representative shapes enclosing 3D solids.

Figure 1:
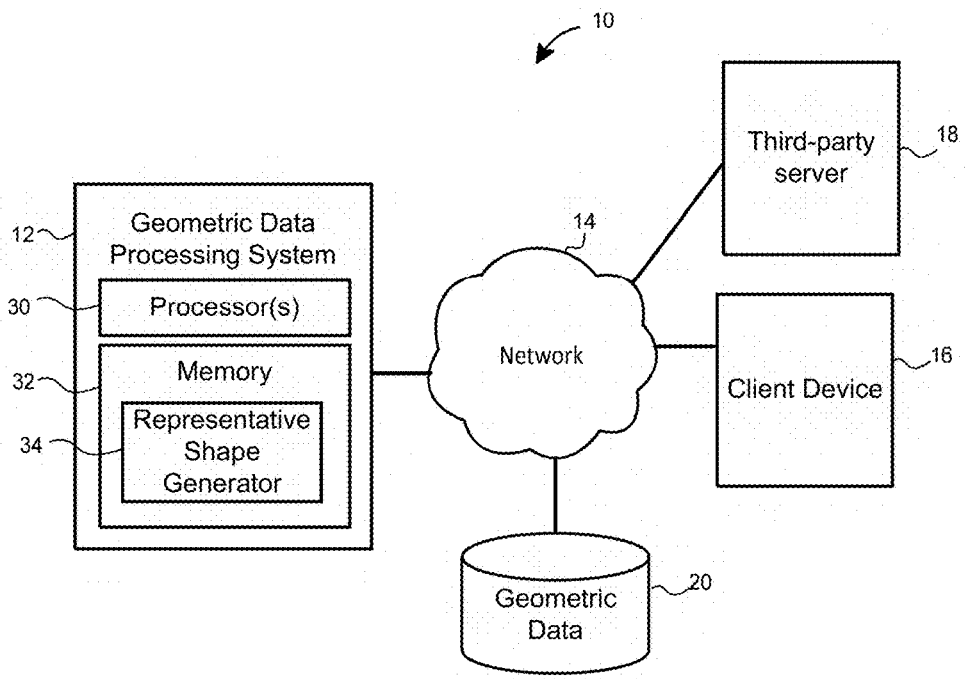
FIG. 1 is a block diagram of an example computing environment in which the techniques of this disclosure for computing representative shapes can be implemented.

FIG. 1 illustrates a computing environment 10 in which techniques for constructing a representative shape can be implemented for such example applications as geographic information system (GIS) processing, computer vision, computer graphics, computational geometry, reconstruction of objections from 3D scans or LIDAR point measurements (or other surface reconstructions and region bounding problems), collision detection and prediction (as a more specific example, constructing approximate bounds of complex objects for robotics or augmented reality and/or virtual reality interaction), OCR and image classification and recognition (e.g., classifying objects by comparison of characteristic shapes).

In the computing environment 10, a processing system 12 can communicate with various client devices, application servers, web servers, and other devices via a communication network 14. The processing system 12 includes one or several servers or other suitable computing devices. The communication network 14 can be a wide-area network (WAN) or a local-area network (LAN), for example, and can include wired and/or wireless communication links. A client device 16 can be any suitable portable or non-portable computing device, and the third-party server 18 can be any suitable computing device that provides web content, applications, storage, etc. to various client devices.

The processing system 12 can operate on geometric data stored in a database 20, which can be implemented in any suitable manner. The geometric data can include collections of points and/or polygons. A point can be defined using two coordinates (x, y) in two dimensions or three coordinates (x, y, z) in three dimensions. For example, a point cloud can be a collection of data in which each point is specified by three coordinates. In some the implementations, the database 20 can store additional data such as color, z-depth, etc. for each point. Polygons can be defined as sequences of vertices in two or three dimensions. More generally, the database 20 can store definitions of points and polygons, as well as indications of relative positioning of points and polygons, in any suitable manner.

The processing system 12 also can receive geometric data from remote or local sources. For example, the third-party server 18 can operate on 3D scan data and request that the processing system 12 process a certain data set to determine a representative shape for a set of polygons to determine the boundaries of an object. As another example, the client device 16 can upload a data set including polygons to the processing system 12 and request that the processing system 12 compute a representative shape for the data set, to be used at the client device 16 in an augmented reality application. To this end, a data formatting API for supplying a data set to the processing system 12 in a certain format can be exposed to various devices. The data formatting API can be provided for one or multiple computing platforms, and can include instructions for specifying a two- or three-dimensional data set on which the processing system 12 can operate. The data set generally speaking describes a set of polygons and/or points and relative positioning of these polygons and/or points.

As illustrated in FIG. 1, the processing system 12 can include one or more processors 30 and a memory 32. The one or more processors 30 can include CPUs, GPUs, special-purpose hardware, etc. The memory 32 can include persistent and non-persistent components in any suitable configuration. If desired, these components can be distributed among multiple network nodes. The memory 32 stores instructions that implement a representative shape generator 34 configured to compute representative shapes.

If desired, the functionality of the representative shape generator 34 also can be implemented as a representative shape generation API, which various applications executing on servers and/or client devices can invoke. For example, the client device 16 can store instructions that implement the representative shape generation API in a local memory. Image processing, gaming, and other applications executing on the client device 16 can invoke the representative shape generation API when necessary, without having to send data to the processing system 12.

Figure 2:
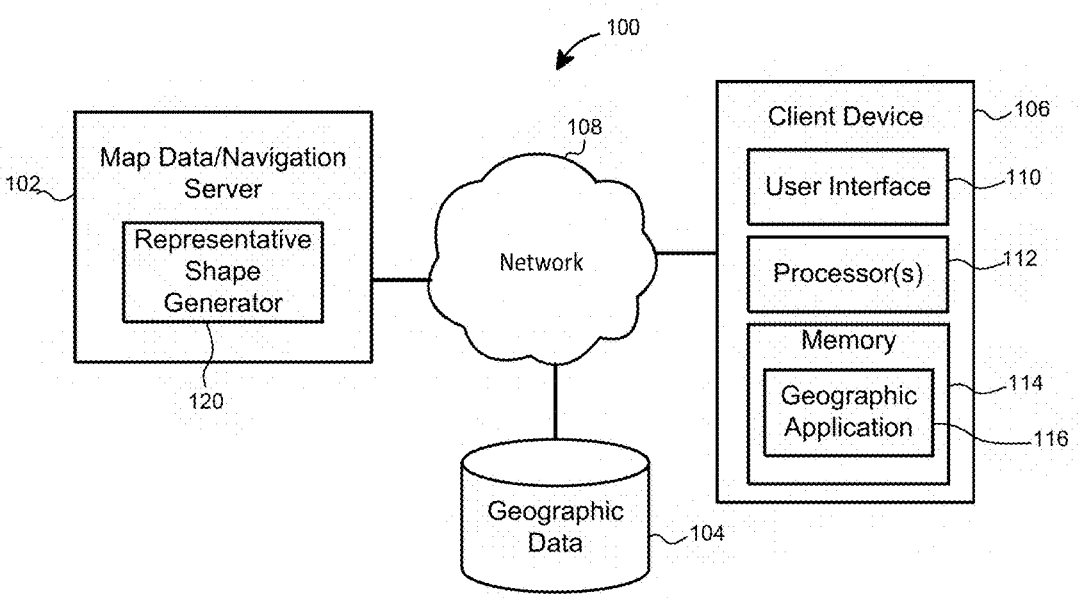
FIG. 2 is a block diagram of an example geographic system in which the techniques of this disclosure for computing representative shapes can be used with geographic features.

As a more specific example of implementation of the techniques of this disclosure, FIG. 2 illustrates an example geographic system 100 in which representative shapes can be computed for various geographic features.

The system 100 includes a map data/navigation server system 102, which can include one or multiple servers at one or multiple locations. The server system 102 can be communicatively coupled to a geographic database 104. In this example, the server system 102 accesses the geographic database 104 via a communication network 108. In other implementations, the geographic database 104 can be integral with the server system 102. Various client devices, web content servers, etc. can access the server system 102 via the communication network 108.

An example client device 106 includes a user interface 110, one or more processors 112, and a memory 114. The memory 114 can include persistent and non-persistent components. The client device 106 can be a portable device such as a smart phone, a tablet computer, a wearable device such as a smart watch, a non-portable device such as a desktop computer, or any other suitable type of device.

A geographic application 116 can be stored in the memory 114 a set of instructions executable by the one or more processors 112. The geographic application 114 can generate interactive digital maps, provide navigation instructions, receive geographic search queries via the user interface 110, etc.

The geographic database 104 can store map data that includes two-dimensional descriptions and locations of various geographic features such as roads, rivers, lakes, islands, buildings, transportation lines, parks, county boundaries, etc. These definitions can be stored in a vector graphics format supported by the client device 106, for example. Map data in some implementations is partitioned into tiles for efficient assembly into digital maps at the client device 106. The geographic database 104 also can store 3D descriptions of geographic features in the form of interconnected vertices, defining wireframes, and textures to be applied to wireframes.

In one example scenario, the representative shape generator 120 operates in a batch mode on the map data stored in the geographic database 104. The representative shape generator 120 retrieves map data for a set of related features such as islands of an archipelago, for example, or buildings and various structures associated with a college campus. Each of the features is represented by a respective polygon, and the map data the representative shape generator 120 retrieves includes indications of the geometries of these polygons as well as the locations of these polygons relative to each other. The representative shape generator 120 generates a representative shape using the techniques of this disclosure and, in one implementation, stores the generated representative shape in the geographic database 104. At this time or a later time, the representative shape generator 120 can use these representative shapes to apply labels to the sets of related geographic features, draw boundaries and apply shadings to the sets of related geographic features when generating map tiles, generate customized representations of related sets of geographic features in response to requests from client In another example scenario, the representative shape generator 120 computes a representative shape dynamically, in response to a particular event. The server system 102 for example receives an indication that a winter storm warning has been issued for several counties, which are not necessarily adjacent, and the representative shape generator 120 computes a representative shape for the specified group of counties in order to generate map tiles in which the representative shape is highlighted, for distribution to client devices. To this end, the representative shape generator 120 retrieves the polygons describing the boundaries of the counties from the geographic database 104.

In yet another example scenario, the geographic application 116 displays a digital map of a certain geographic area via the user interface 110, and the user submits a geographic query, such as "sandwich places." The geographic application 116 forwards the query to the server system 102, which in turn identifies several buildings with sandwich shops within the geographic area illustrated in the digital map. The representative shape generator 120 retrieves polygons representing the footprints for the buildings with sandwich shops and computes a representative shape for this group of polygons. The server system 102 then provides this representative shape along with the search results to the client device 106. The geographic application 116 can use the representative shape to highlight the geographic area in which sandwich shops are available. Thus, similar to the example above, the representative shape generator 120 in this case operates dynamically, in response to a user query.

Similar to the representative shape generator 34 discussed with reference to FIG. 1, the functionality of the representative shape generator 120 can be implemented as an API and invoked by the geographic application 116, or simply as a built-in component of the geographic application 116. The server system 102 can provide map data in a vector graphics format to the client device 106, and the geographic application 116 can determine representative shapes for various groups of map features in response to various user queries, requests, etc., without requesting these representative shapes or new map data from the server system 102.

Figure 3:
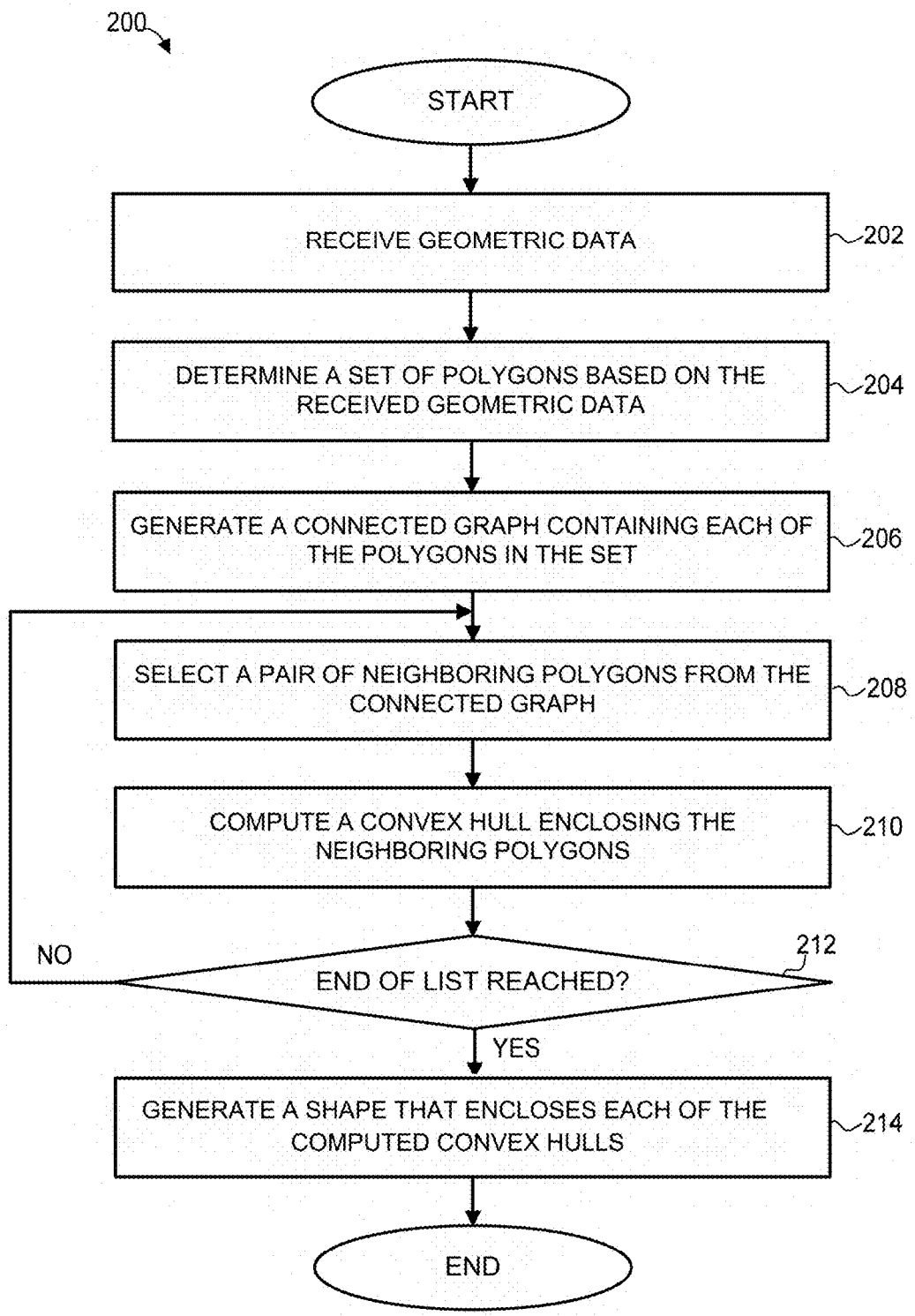
FIG. 3 is a flow diagram of an example method for computing a representative shape for a set of polygons.

Now referring to FIG. 3, an example method 200 for computing a representative shape for a set of polygons can be implemented as a set of instructions stored on a computer-readable medium and executable by one or more processors. For example, the method 200 can be implemented in the representative shape generator 34 of FIG. 1 or the representative shape generator 120 of FIG. 2. The method 200 is discussed below with reference to the diagrams of FIGS. 5A-8D.

At block 202, geometric data is received and, at block 204, a set of polygons is determined based on the received geometric data. The geometric data can correspond to plane objects or 3D solids. In some scenarios, the received geometric data includes indications of geometry for a set of polygons as well as indications of relative positions of the polygons, in which case the identification of polygons at block 204 is trivial. In other scenarios, the geometric data includes a point set rather than definitions of polygons, in which case block 204 can include partitioning of the point set into polygons using Voronoi diagrams, for example, or another suitable technique.

Several example sets of polygons are illustrated in FIGS. 5A, 6A, 7A, and 8A. In particular, FIG. 5A depicts an example polygon set 300, with polygons A-1, B-1, C-1, D-1, and E-1. The relative arrangement of these polygons is generally similar to an arc. FIG. 6A depicts an example polygon set 350, with polygons A-2, B-2, C-2, D-2, and E-2. These polygons are arranged in an approximate loop. FIG. 7A depicts an example polygon set 400, with polygons A-3, B-3, C-3, D-3, and E-3. The relative arrangement of these polygons is generally similar to the letter 'S.' FIG. 8A depicts an example polygon set 450, with polygons A-4, B-4, C-4, D-4, and E-4. The relative arrangement of these polygons is generally similar to a hook.

FIGS. 5B, 6B, 7B, and 8B illustrate convex hulls 310, 360, 410, and 460 generated for the sets of FIGS. 5A, 6A, 7A, and 8A, respectively. As illustrated in these figures, the hulls 310, 360, 410, and 460 do not accurately reflect the underlying constituent geometry of the corresponding polygon sets.

Referring again to FIG. 3, the flow of the method 200 proceeds to block 206, where the set of polygons is ordered. Generally speaking, method 200 here determines an order in which each of the polygons in the set can be "visited." The order may be such that each polygon is visited exactly once, and the path that traverses the set of polygons is the shortest. Executing block 206 accordingly can include executing a suitable algorithm to obtain an acceptable numerical solution to the Traveling Salesman Problem or, more particularly, determining the Shortest Hamiltonian Path. One example heuristic that can be used at block 206 is the repeated-nearest-neighbor algorithm, which generally yields an ordering consistent with visual ordering. Referring to FIG. 5A, for example, the repeated-nearest-neighbor algorithm may be applied to a graph in which distances are calculated between the centroids of the polygons A-1, B-1, C-1, D-1, and E1, which in turn can be computed using any suitable technique, including those known in the art. In another implementation, the repeated-nearest-neighbor algorithm may be applied to a graph in which distances between nearest edges or vertices are used. Further, as an alternative to the repeated-nearest-neighbor heuristic, Minimum Spanning Trees can be used in another implementation.

The ordering generated for the example polygon sets of FIGS. 5A-8D is reflected in the labels used in these figures, for ease of illustration. In particular, the sets of polygons in FIGS. 5A, 6A, 7A, and 8A may be initially received in an unordered form, and executing block 206 results in ordering polygon 'A-x' before 'B-x,' 'B-x' before 'C-x,' etc. Thus, for the set of polygons of FIG. 5A, the order is (A-1, B-1, C-1, D1, and E-1), for the set of polygons of FIG. 6A, the order is (A-2, B-2, C-2, D-2, and E-2), etc.

With continued reference to FIG. 3, a pair of neighboring polygons is selected from the ordered list at block 208 and, at block 210, an overlapping convex hull is selected for the two neighboring polygons. The method 200 checks at block 212 whether the list is exhausted, and the flow either returns to block 208 for another iteration or proceeds to block 214. For an ordered list of polygons L=($P_1$, $P_2$, $P_3$, . . . $P_N$), pair ($P_1$, $P_2$) is selected in the first instance of executing block 208, pair ($P_2$, $P_3$) is selected in the second instance of executing block 208, ($P_3$, $P_4$) is selected in the third instance of executing block 208, etc.

Referring again to the example polygon sets of FIGS. 5A-8D, the pairwise selection and convex hull computation of blocks 208-212 is illustrated in FIGS. 5C, 6C, 7D, and 8D. Referring specifically to FIG. 5C, for example, a pairwise convex hull PCH-1 is computed for the first pair of polygons A-1 and B-1, a pairwise convex hull PCH-2 is computed for the second pair of polygons B-1 and C-1, a pairwise convex hull PCH-3 is computed for the third pair of polygons C-1 and D-1, and a pairwise convex hull PCH-4 is computed for the fourth pair of polygons D-1 and E-1.

Referring again to FIG. 3, an compound hull for the pairs of polygons is determined at block 214. The compound hull can be used as a representative shape for the corresponding set of polygons. In one implementation, the compound hull is a union of the pairwise convex hulls determined at blocks 208-212.

Referring to FIGS. 5D, 6D, 7D, and 8D, applying the method 200 can yield the compound hulls 320, 370, 420, and 470 for the corresponding polygon sets. As a more specific example, the compound hull 320 is a union of the pairwise convex hulls PCH-1, PCH-2, PCH-3, and PCH-4. Comparing the compound hull 320 to the convex hull of 5B, and similarly comparing the compound hulls 370, 420, and 470 to the convex hulls of 5B, 6B, and 7B, the underlying constituent geometry of the polygon sets is reflected much more accurately in the compound hulls generated using the method 200 rather than known techniques.

In some implementations, a smoothing technique can be applied to the compound hull generated at block 214. For example, if the compound hull includes an excessive number of vertices (e.g., exceeding a certain threshold value), some of the vertices can be eliminated by directly connecting, with a new edge, the vertices on either side of the vertex being removed. The smoothing technique additionally or alternatively can include applying a basis spline function or using Bezier curves, for example.

Figure 4:
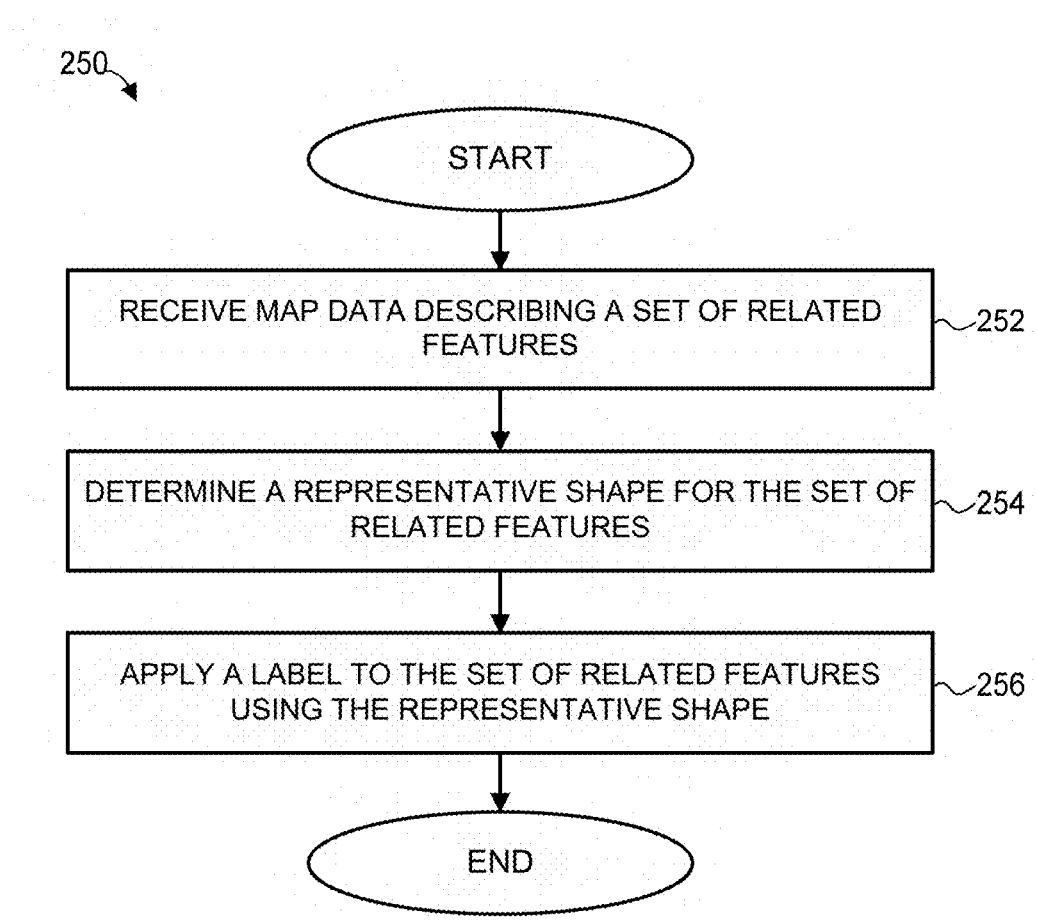
FIG. 4 is a flow diagram of an example method for using the method of FIG. 3 to apply a label to a set of related geographic features.

Next, FIG. 4 illustrates an example method 250 for using the method 200 to apply a label to a set of related geographic features. The method 250 can be implemented in the map data/navigation server 102 or the geographic application 114 of FIG. 2, for example. The method 250 is only example of applying a representative shape generated in accordance with the method 200, and in general the method 200 can be applied in a wide variety of applications.

The method 250 begins at block 252, were map data describing a set of related of geographic features is received. The map data can be retrieved from a map database such as the geographic database 104 of FIG. 2, received from a third-party server or a client device, etc. In any case, the map data received at block 252 indicates the geometry of a set of polygons and the relative positioning of these polygons.

At block 254, a representative shape is computed for the received map data. To this end, the method 200 of FIG. 3 can be used.

Next, at block 256, a label is applied to the generated representative shape. For example, the longest edge of the polygon 320 can be selected (in this case, the upper edge connecting the vertices of polygon B-1 and C-1), and a label can be positioned along this longest edge. In the implementations, the positioning of the label relative to the representative shape further depends on the length of the label, so that for example a shorter label is positioned along the edge of the representative shape that is closer in length to the label, even if the edge is not the longest in the representative shape. More generally, the representative shape can be used for label positioning in any suitable manner. As another example, a label can be superimposed on the representative shape along the medial axis of the polygon 320. Another example of label placement selection involves determining a suitable section of the boundary of the representative shape using local curvature/radius to avoid labeling bends that are excessively sharp. Other examples of using the generated representative shape include orthogonal offsetting (expanding/shrinking) of the boundary of the representative shape for label placement or visual differentiation of the representative shape from the underlying geometry boundaries.

The representative shape more generally can be used at block 256 for any suitable purpose such as highlighting the set of polygons, retrieving information for the entire set of polygons, extracting and repositioning the set of polygons relative to the digital map as a single representative shape (when it is desirable to visually compare the overall size of one archipelago to the overall size of another archipelago by dragging one over the other, for example), etc.

Another example approach to generating a representative shape for several polygons is discussed with reference to FIG. 9A-G. A set of polygons 480 illustrated in FIG. 9A can be enclosed within a convex hull 482 generated using conventional techniques (see FIGS. 9B and 9C). FIG. 9D illustrates an example minimum spanning tree 490, which the systems of FIGS. 1 and 2 can generate. Using the minimum spanning tree 490, a set 492 of pairwise convex hulls can be generated as illustrated in FIG. 9E, in the manner generally similar to that discussed above with reference to FIGS. 5A-8D. A union of the set 492 can be generated next, as illustrated in FIG. 9F. A representative shape 494 can be generated using the generated union 494.

In general, there exist numerous techniques for generating a connected graph for a set points and/or polygons. The systems of FIGS. 1 and 2 can use these techniques to organize a set of polygons (or, more generally, shapes) for computation of pairwise convex hulls.

Figure 10:
FIG. 10 illustrates an example digital map of a group of islands and a label whose position is calculated using the techniques of this disclosure for computing representative shapes.

FIG. 10 illustrates an example digital map 500 of Hawaii, which of course is a chain of islands, and a corresponding text label 502. The map data/navigation server system 102 can determine the position of the label 502 relative to the islands by using the methods 200 and 250 discussed above. The positioning of the label 502 clearly conveys to the user the underlying geometry of the Hawaiian islands viewed together.

Additional Considerations

The following additional considerations apply to the foregoing discussion. Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of various embodiments. This description should be read to include one or at least one and the singular also includes the plural unless it is obvious that it is meant otherwise.

Upon reading this disclosure, those of ordinary skill in the art will appreciate still additional alternative structural and functional designs for computing representative shapes for a set of polygons through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A computer-implemented method for efficiently processing sets of shapes, the method comprising:

receiving, by one or more processors, a description of a set of shapes, the description including an indication of geometry for each of the shapes and an indication of positioning of the shapes relative to each other;

generating, by the one or more processors, a connected graph containing each shape in the set of shapes;

determining a shortest path that traverses each in the set of shapes exactly once;

for each pair of shapes adjacent to each other in the connected graph, generating a respective overlapping convex hull enclosing the pair of shapes, by the one or more processors;

generating, by the one or more processors, a representative shape for the set of shapes, the representative shape enclosing each of the generated convex hulls; and operating, by the one or more processors, on the generated representative shape to perform an operation related to the set of shapes.

2. The computer-implemented method of claim 1, wherein determining the shortest path includes using a nearest-neighbor algorithm.

3. The computer-implemented method of claim 1, wherein determining the shortest path includes determining distances between centroids of the shapes.

4. The computer-implemented method of claim 1, further comprising calculating a minimum spanning tree for the set of shapes.

5. The computer-implemented method of claim 1, wherein generating the representative shape for the set of shapes includes determining a union of the generated convex hulls.

6. The computer-implemented method of claim 1, wherein each shape in the set of shapes is a polygon representing a geographic feature on a digital map.

7. The computer-implemented method of claim 6, wherein operating on the generated representative shape includes determining, by the one or more processors, a position of a label relative to the generated representative shape, wherein the label refers to the entire set of polygons.

8. The computer-implemented method of claim 1, wherein operating on the generated representative shape includes determining a boundary of an object with which the set of shapes are associated in an image processing application.

9. A system comprising:
one or more processors; and
a non-transitory computer-readable memory storing thereon instructions that, when executed by the one or more processors, cause the system to:
receive a description of a set of shapes, the description including an indication of geometry for each of the shapes and an indication of positioning of the shapes relative to each other,
determine a shortest path that traverses each shape in the set of shapes exactly once,
generate a connected graph containing each shape in the set of shapes,
for each pair of shapes adjacent to each other in the connected graph, generate a respective overlapping convex hull enclosing the pair of shapes,
generate a representative shape for the set of shapes, the representative shape enclosing each of the generated convex hulls, and
operate on the generated representative shape to perform an operation related to the set of shapes.

10. The system of claim 9, wherein to generate the representative shape for the set of shapes, the instructions cause the system to determine a union of the generated convex hulls.

11. The system of claim 9, wherein each shape in the set of shapes is a polygon representing a geographic feature on a digital map.

12. The system of claim 11, wherein the instructions further cause the system to determine a label relative to the generated representative shape, wherein the label refers to the entire set of polygons.

13. A non-transitory computer-readable medium storing thereon instructions that, when executed by one or more processors, cause the processors to carry out a method comprising:
receiving a description of a set of shapes, the description including an indication of geometry for each of the shapes and an indication of positioning of the shapes relative to each other;
determining a shortest path that traverses each in the set of shapes exactly once;
generating a connected graph containing each shape in the set of shapes;
for each pair of shapes adjacent to each other in the connected graph, generating a respective overlapping convex hull enclosing the pair of shapes;
generating a representative shape for the set of shapes, the representative shape enclosing each of the generated convex hulls; and
operating on the generated representative shape to perform an operation related to the set of shapes.

14. The non-transitory computer-readable medium of claim 13, wherein determining the shortest path includes using a nearest-neighbor algorithm.

15. The non-transitory computer-readable medium of claim 13, wherein the method further includes calculating a minimum spanning tree.

16. The non-transitory computer-readable medium of claim 13, wherein determining the shortest path includes determining distances between centroids of the shapes.

17. The non-transitory computer-readable medium of claim 13, wherein generating the representative shape for the set of shapes includes determining a union of the generated convex hulls.

* * * * *